(12) United States Patent
Jeong et al.

(10) Patent No.: US 10,332,797 B2
(45) Date of Patent: Jun. 25, 2019

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Yongkuk Jeong, Yongin-si (KR); Gi Gwan Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 163 days.

(21) Appl. No.: 15/480,605

(22) Filed: Apr. 6, 2017

(65) Prior Publication Data

US 2017/0323831 A1 Nov. 9, 2017

(30) Foreign Application Priority Data

May 3, 2016 (KR) ........................ 10-2016-0054513

(51) Int. Cl.
*H01L 21/308* (2006.01)
*H01L 21/8234* (2006.01)
*H01L 21/8238* (2006.01)

(52) U.S. Cl.
CPC .. *H01L 21/823418* (2013.01); *H01L 21/3081* (2013.01); *H01L 21/3083* (2013.01); *H01L 21/823425* (2013.01); *H01L 21/823431* (2013.01); *H01L 21/823437* (2013.01); *H01L 21/823481* (2013.01); *H01L 21/823814* (2013.01); *H01L 21/823821* (2013.01); *H01L 21/823878* (2013.01); *H01L 21/823828* (2013.01)

(58) Field of Classification Search
CPC .......... H01L 21/38083; H01L 21/3085; H01L 21/3086; H01L 21/823481; H01L 21/823878
See application file for complete search history.

(56) References Cited

U.S. PATENT DOCUMENTS

| 7,579,252 | B2 | 8/2009 | Goulakov |
| 7,719,043 | B2 | 5/2010 | Yamagami et al. |
| 8,133,797 | B2 | 3/2012 | Van Schravenkijk et al. |
| 8,796,150 | B2 | 8/2014 | Akinmade-Yusuff et al. |
| 8,906,760 | B2 | 12/2014 | Ranjan et al. |
| 8,921,177 | B2 | 12/2014 | Yeh et al. |
| 2015/0357332 | A1 | 12/2015 | Liu et al. |

FOREIGN PATENT DOCUMENTS

KR 10-2004-0008685 A 1/2004

*Primary Examiner* — Amar Movva
(74) *Attorney, Agent, or Firm* — Lee & Morse, P.C.

(57) ABSTRACT

A method for fabricating a semiconductor device includes forming first gate stacks on a first region of a substrate to be spaced apart by a first distance, forming second gate stacks on a second region of the substrate to be spaced apart by a second distance greater than the first distance, forming a first blocking film along the first gate stacks and the substrate, a thickness of the first blocking film between the first gate stacks being a first thickness, forming a second blocking film along the second gate stacks and the substrate, a thickness of the second blocking film between the second gate stacks being a second thickness different from the first thickness, and removing the first blocking film, the second blocking film, and the substrate to form a first recess between the first gate stacks and a second recess between the second gate stacks.

20 Claims, 14 Drawing Sheets

METHOD FOR FABRICATING SEMICONDUCTOR DEVICE

CROSS-REFERENCE TO RELATED APPLICATION

Korean Patent Application No. 10-2016-0054513, filed on May 3, 2016, in the Korean Intellectual Property Office, and entitled: "Method for Fabricating Semiconductor Device," is incorporated by reference herein in its entirety.

BACKGROUND

1. Field

The present disclosure relates to a method for fabricating a semiconductor device.

2. Description of the Related Art

For semiconductor device density enhancement, the multigate transistor has been suggested as one of the scaling technologies, according to which a multi-channel active pattern (or silicon body) in a fin or nanowire shape is formed on a substrate, with gates then being formed on a surface of the multi-channel active pattern. This multigate transistor allows easy scaling, as it uses a three-dimensional channel. Further, current control capability can be enhanced without requiring increased gate length of the multigate transistor. Furthermore, it is possible to effectively suppress short channel effect (SCE) which is the phenomenon that the electric potential of the channel region is influenced by the drain voltage.

SUMMARY

According to an aspect of embodiments, there is provided a method for fabricating a semiconductor device including forming first gate stacks being spaced apart by a first distance, on a substrate in a first region, forming second gate stacks being spaced apart by a second distance that is greater than the first distance, on the substrate in a second region, forming a first blocking film along the first gate stacks and the substrate in the first region, a thickness of the first blocking film on the substrate between the first gate stacks being a first thickness, forming a second blocking film along the second gate stacks and the substrate in the second region, a thickness of the second blocking film on the substrate between the second gate stacks being a second thickness that is different from the first thickness, and removing the first blocking film, the second blocking film, and the substrate to form a first recess between the first gate stacks and a second recess between the second gate stacks.

According to another aspect of embodiments, there is provided a method for fabricating a semiconductor device including forming first gate stacks being spaced apart by a first distance, on a substrate in a first region, forming second gate stacks being spaced apart by a second distance that is greater than the first distance, on the substrate in a second region, conformally forming a spacer film along the first gate stacks, the second gate stacks, and upper surfaces of the substrate, and forming a blocking film along the first gate stacks, the second gate stacks, and the upper surfaces of the substrate, after forming the spacer film, wherein a thickness of the blocking film on the substrate between the first gate stacks is less than a thickness of the blocking film on the substrate between the second gate stacks, a thickness of the blocking film on upper surfaces of the first gate stacks is greater than the thickness of the blocking film on the substrate between the first gate stacks, and a thickness of the blocking film on upper surfaces of the second gate stacks is equal to, or greater than the thickness of the blocking film on the substrate between the second gate stacks.

According to yet another aspect of embodiments, there is provided a method for fabricating a semiconductor device, including forming first gate stacks on a first region of a substrate, such that the first gate stacks are spaced apart by a first distance, forming second gate stacks on a second region of the substrate, such that the second gate stacks are spaced apart by a second distance greater than the first distance, forming a first blocking film along the first gate stacks and the substrate in the first region, a thickness of the first blocking film on the substrate between the first gate stacks being a first thickness, forming a second blocking film along the second gate stacks and the substrate in the second region, a thickness of the second blocking film on the substrate between the second gate stacks being a second thickness larger than the first thickness, and etching the substrate between adjacent first gate stacks and adjacent second gate stacks through the first blocking film and the second blocking film, respectively, to form a first recess between adjacent first gate stacks and a second recess between adjacent second gate stacks.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinbelow, a method for fabricating a semiconductor device according to some exemplary embodiments will be explained with reference to FIGS. 1 to 8.

FIGS. 1 to 8 are views of intermediate stages in a method for fabricating a semiconductor device according to some exemplary embodiments.

The drawings regarding a method for fabricating a semiconductor device according to some exemplary embodiments exemplify a method for forming a planar transistor, but are not limited thereto. The method for fabricating a semiconductor device according to some exemplary embodiments may be used for a method for fabricating a semiconductor device having a variety of structures, e.g., buried channel array transistors (BCATs) or recess channel array transistors (RCATs). Further, the semiconductor device fabricated using the method for fabricating a semiconductor device according to some exemplary embodiments may include, e.g., a bipolar junction transistor, a laterally diffused metal oxide semiconductor (LDMOS) transistor, and so on.

Figure 1:
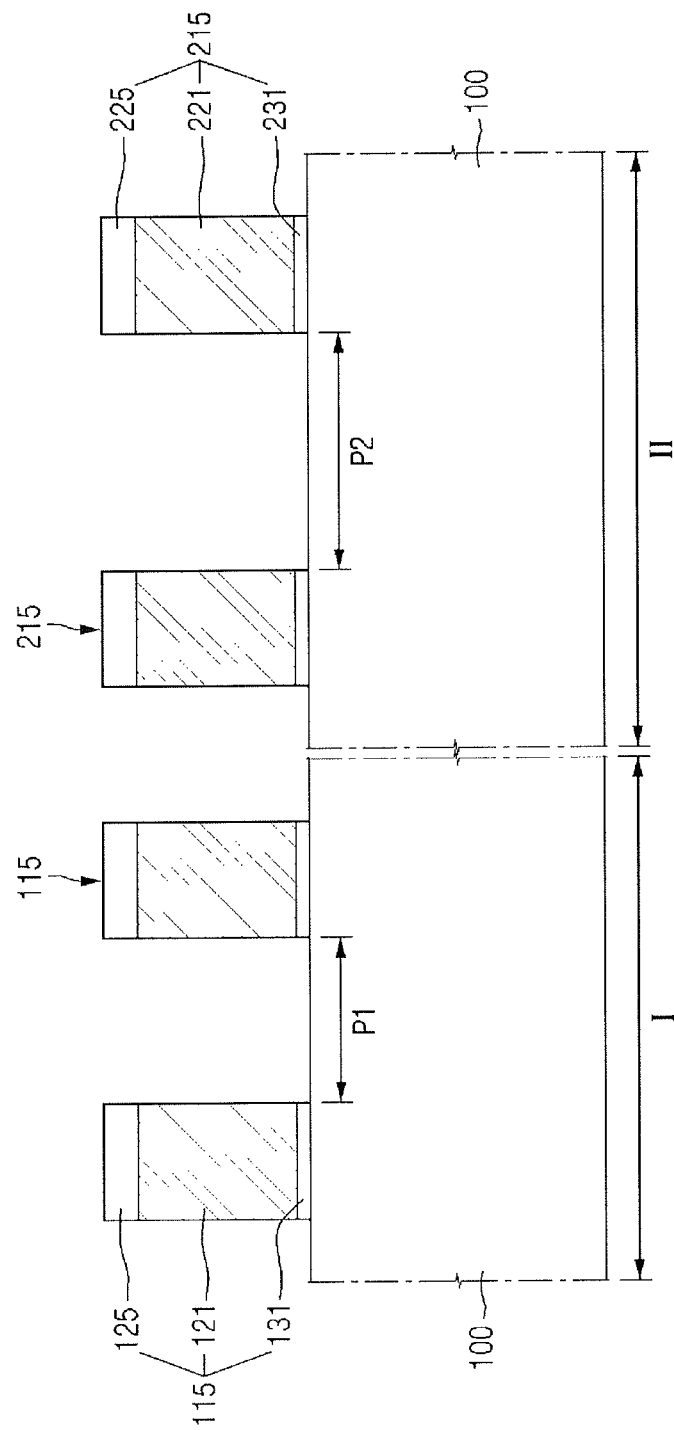
FIGS. 1 to 8 illustrate cross-sectional views of intermediate stages in a method for fabricating a semiconductor device according to some exemplary embodiments.

Referring to FIG. 1, a plurality of first gate stacks 115 may be formed on the substrate 100 in the first region I. Further, a plurality of second gate stacks 215 may be formed on the substrate 100 in the second region II.

The first gate stacks 115 formed in the first region I may be spaced apart by a first pitch P1, and the second gate stacks 215 formed in the second region II may be spaced apart by a second pitch P2. As illustrated in FIG. 1, hereinafter, each of the first and second pitches P1 and P2 refers to a distance between facing sidewalls of adjacent gate stacks.

The first pitch P1, by which the first gate stacks 115 are spaced apart, may be different from the second pitch P2, by which the second gate stacks 215 are spaced apart. For example, the second pitch P2, by which the second gate stacks 215 are spaced apart, may be greater than the first pitch P1, by which the first gate stacks 115 are spaced apart.

The substrate 100 may include the first region I and the second region II. The first region I and the second region II may be spaced apart from each other, or connected with each other. Transistors of different types may be formed in the first region I and the second region II, or alternatively, transistors of the same type may be formed in each of the first and second regions I and II.

Further, the first region and the second region II may each be one of, e.g., logic region, static random access memory (SRAM) region, and input/output (IO) region. That is, the first region I and the second region II may be regions performing a same function, or regions performing different functions.

With a method for fabricating a semiconductor device according to some exemplary embodiments, the same conductivity type transistors may be formed in the first region I and the second region II.

The first gate stacks 115 may include a first gate insulating film 131, a first gate electrode 121, and a first gate hard mask 125 formed sequentially, e.g., directly, on the substrate 100. The second gate stacks 215 may include a second gate insulating film 231, a second gate electrode 221, and a second gate hard mask 225 formed sequentially, e.g., directly, on the substrate 100.

For example, an insulating film, a conductive film, and a hard mask film may be sequentially formed on the substrate 100. A mask pattern for forming the first gate stacks 115 and the second gate stacks 215 may be formed on the hard mask film. By etching with the mask pattern as a mask, the first gate stacks 115 may be formed on the substrate 100 in the first region I, and the second gate stacks 215 may be formed on the substrate 100 in the second region II. After the first gate hard mask 125 and the second gate hard mask 225 are formed by using the mask patterns, the first and second gate electrodes 121, 221, and the first and second gate insulating films 131, 231 may be formed by using the first gate hard mask 125 and the second gate hard mask 225 as the masks such that the first gate stacks 115 and the second gate stacks 215 may be formed.

For example, the substrate 100 may be a bulk silicon or a silicon-on-insulator (SOI). In another example, the substrate 100 may be a silicon substrate, or may include other materials, e.g., silicon germanium, silicon germanium on insulator (SGOI), indium antimonide, lead telluride, indium arsenide, indium phosphide, gallium arsenide, or gallium antimonide, but not limited thereto. In the following description, it is assumed that the substrate 100 is a silicon substrate.

The first and second gate insulating films 131, 231 may include, e.g., silicon oxide, silicon oxynitride, silicon nitride, and a combination of these. The first and second gate insulating films 131, 231 may be formed by using, e.g., heat treatment, chemical treatment, atomic layer deposition (ALD), chemical vapor deposition (CVD), and so on.

The first and second gate electrodes 121, 221 may be silicon, e.g., may include one of polycrystalline silicon (poly Si), amorphous silicon (a-Si), and a combination thereof. The first and second gate electrodes 121, 221 may not be doped with impurity, or may be doped with impurity. The poly Si may be formed by using, e.g., the CVD, and the a-Si may be formed by using, e.g., sputtering, CVD, plasma deposition, and so on, although exemplary embodiments are not limited thereto.

The first and second gate hard masks 125, 225 may include, e.g., nitride film, oxide film, and a combination thereof. The first and second gate hard masks 125, 225 may be formed, e.g., by using CVD.

In describing a method for fabricating a semiconductor device according to some exemplary embodiments, the first and second gate electrodes 121, 221 are replaced with a replacement metal gate in a subsequent process, but exemplary embodiments are not limited thereto. That is, the first and second gate electrodes 121, 221 may be utilized as the actual gate electrodes of transistors, rather than serving as molds to ensure space for the subsequent process. When the first and second gate electrodes 121, 221 are utilized as the actual gate electrodes of the transistors, the first and second gate electrodes 121, 221 may include metal material. This will be described below with reference to FIG. 8.

Additionally, the first and gate insulating films 131, 231 may also be utilized as the actual gate insulating films of the transistors. When the first and second gate insulating films 131, 231 are utilized as the actual gate insulating films of the transistors, the first and second gate insulating films 131, 231 may include high-k dielectric film. This will be described below with reference to FIG. 8.

Figure 2:
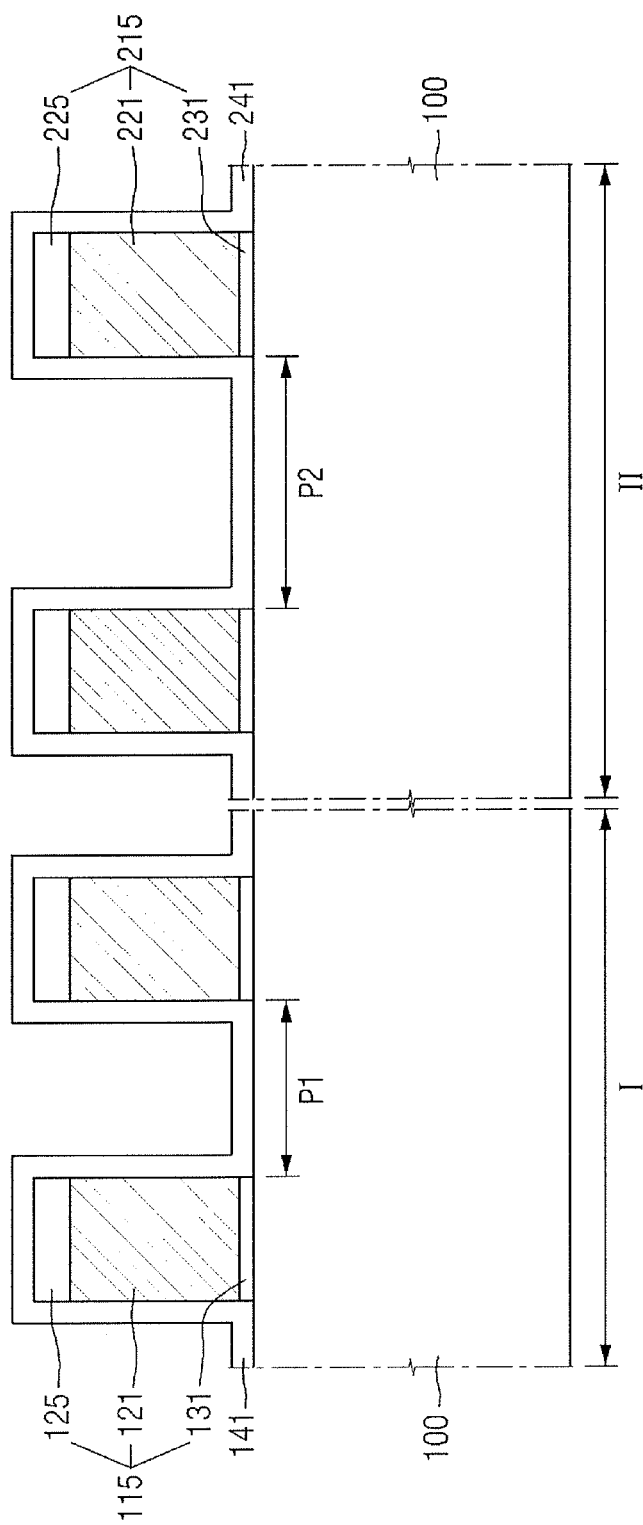

Referring to FIG. 2, a first spacer film 141 may be formed on the first gate stacks 115 and the substrate 100 in the first region I. Further, a second spacer film 241 may be formed on the second gate stacks 215 and the substrate 100 in the second region II.

The first spacer film 141 may be conformally formed along the upper surface of the substrate 100 and the first gate stacks 115. The first spacer film 141 may be formed along the sidewalls and the upper surfaces of the first gate stacks 115.

The second spacer film 241 may be conformally formed along the upper surface of the substrate 100 and the second gate stacks 215. The second spacer film 241 may be formed along the sidewalls and the upper surfaces of the second gate stacks 215.

The first spacer film 141 and the second spacer film 241 may include at least one of, e.g., silicon nitride (SiN), silicon oxynitride (SiON), silicon oxide ($SiO_2$), silicon oxycarbonitride (SiOCN), and a combination thereof. The first spacer film 141 and the second spacer film 241 may be formed by using, e.g., CVD, ALD, and so on. The first spacer film 141 and the second spacer film 241 may be formed by the same fabrication process.

While FIG. 2 illustrates the first spacer film 141 and the second spacer film 241 as single layers, exemplary embodiments are not limited thereto, e.g., the spacer films 141, 241 may be formed as multi-layers. If each of the first spacer film 141 and the second spacer film 241 includes a plurality of films, at least one film of the first spacer film 141 and the second spacer film 241 may include a low-k dielectric material, e.g., silicon oxycarbonitride (SiOCN).

Figure 3:
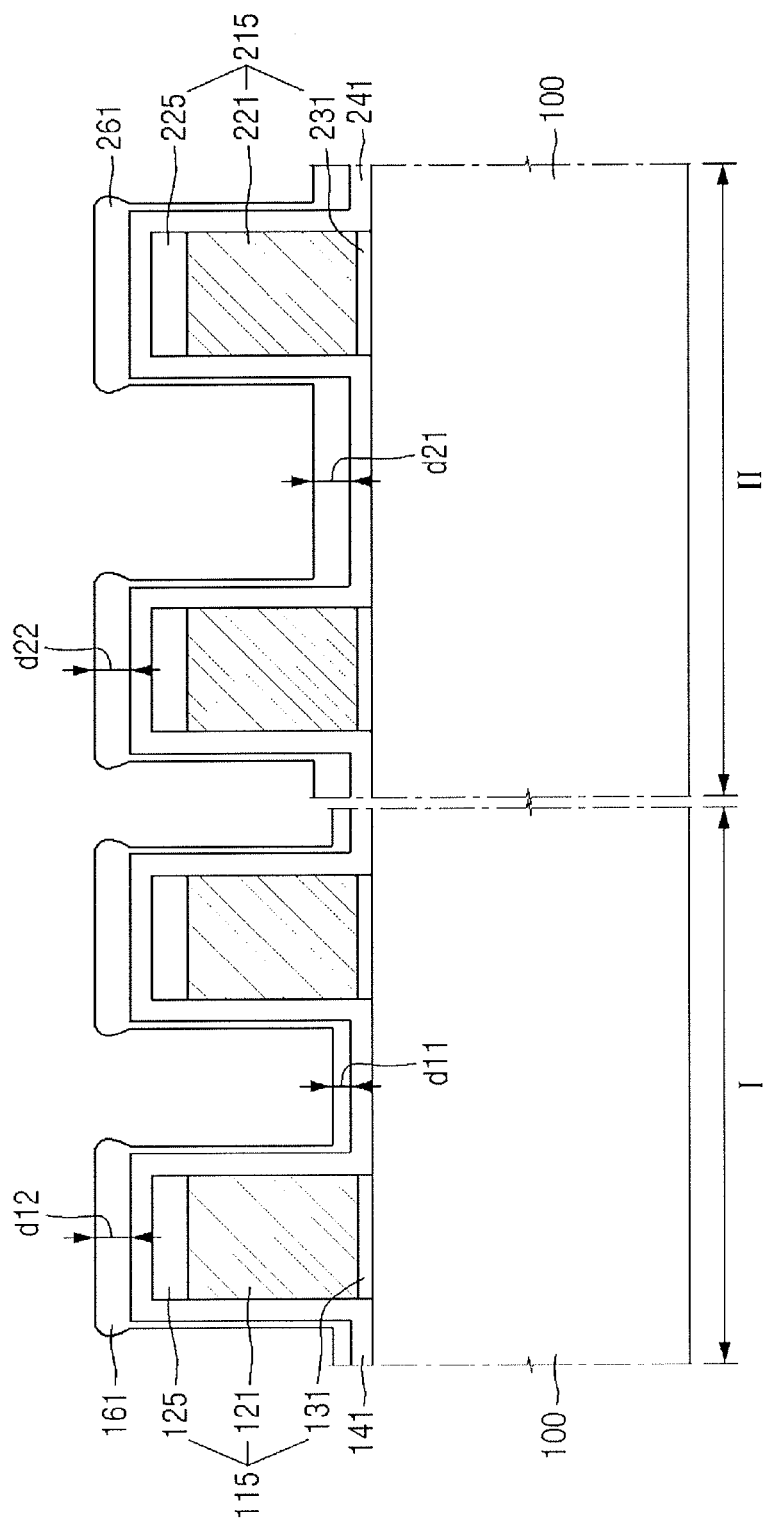

Referring to FIG. 3, a first blocking film 161 may be formed on the first spacer film 141, and a second blocking film 261 may be formed on the second spacer film 241.

The first blocking film 161 may be formed along the upper surface of the substrate 100 in the first region I and the first gate stacks 115. The first blocking film 161 may be formed along the sidewalls and the upper surfaces of the first gate stacks 115. The first blocking film 161 may be formed along a profile of the first spacer film 141.

The second blocking film 261 may be formed along the upper surface of the substrate 100 in the second region II and the second gate stacks 215. The second blocking film 261 may be formed along the sidewalls and the upper surfaces of the second gate stacks 215. The second blocking film 261 may be formed along a profile of the second spacer film 241.

The first blocking film 161 and the second blocking film 261 may include, e.g., silicon oxide ($SiO_2$). The first blocking film 161 and the second blocking film 261 may be formed by using, e.g., a deposition method with poor step coverage. The first blocking film 161 and the second blocking film 261 may be formed by the same fabrication process. Further, the first blocking film 161 and the second blocking film 261 are not conformally formed on the first spacer film 141 and the second spacer film 241, respectively.

In detail, the thickness d12 of the first blocking film 161 on the upper surfaces of the first gate stacks 115 may be substantially the same as the thickness d22 of the second blocking film 261 on the upper surfaces of the second gate stacks 215. This is because the first blocking film 161 and the second blocking film 261 are formed in the same fabricating process, and the upper surfaces of the first gate stacks 115 and the upper surfaces of the second gate stacks 215 are positioned farthest away from the upper surface of the substrate 100.

Since the first blocking film 161 is not conformally formed, the thickness d12 of the first blocking film 161 on the upper surfaces of the first gate stacks 115 is greater than the thickness of the first blocking film 161 on the sidewalls of the first gate stacks 115. Since the second blocking film 261 is not conformally formed, the thickness d22 of the second blocking film 261 on the upper surfaces of the second gate stacks 215 is greater than the thickness of the second blocking film 261 on the sidewalls of the second gate stacks 215.

Additionally, the thickness d12 of the first blocking film 161 on the upper surfaces of the first gate stacks 115 may be greater than the thickness d11 of the first blocking film 161 on the substrate 100 between the first gate stacks 115. The thickness d22 of the second blocking film 261 on the upper surfaces of the second gate stacks 215 may be greater than, or equal to the thickness d21 of the second blocking film 261 on the substrate 100 between the second gate stacks 215.

A source to form the first blocking film 161 and the second blocking film 261 may be provided from above that is higher than the upper surfaces of the first gate stacks 115 and the upper surfaces of the second gate stacks 215. In this case, an amount of the source to form the first blocking film 161 being deposited on the upper surfaces of the first gate stacks 115 may be greater than an amount of the source to form the first blocking film 161 being deposited on the substrate 100 between the first gate stacks 115. Likewise, an amount of the source to form the second blocking film 261 being deposited on the upper surfaces of the second gate stacks 215 may be greater than an amount of the source to form the second blocking film 261 being deposited on the substrate 100 between the second gate stacks 215.

Further, the first pitch ('P1' in FIG. 1) by which the first gate stacks 115 are spaced apart is less than the second pitch ('P2' in FIG. 1) by which the second gate stacks 215 are spaced apart. As a result, it is more difficult to form the first blocking film 161 on the substrate 100 between the first gate stacks 115 than to form the second blocking film 261 on the substrate 100 between the second gate stacks 215, e.g., less material may be deposited between the first gate stacks 115 due to the smaller space therebetween. Accordingly, the thickness d21 of the second blocking film 261 on the substrate 100 between the second gate stacks 215 is greater than the thickness d11 of the first blocking film 161 on the substrate 100 between the first gate stacks 115.

Additionally, the thickness d12 of the first blocking film 161 on the upper surfaces of the first gate stacks 115 is greater than the thickness d11 of the first blocking film 161 on the substrate 100 between the first gate stacks 115. However, the thickness d22 of the second blocking film 261 on the upper surfaces of the second gate stacks 215 may be greater than, or equal to the thickness d21 of the second blocking film 261 on the substrate 100 between the second gate stacks 215. The thickness d12 of the first blocking film 161 on the upper surfaces of the first gate stacks 115 may be greater than, or equal to the thickness d21 of the second blocking film 261 on the substrate 100 between the second gate stacks 215.

Before the first blocking film 161 and the second blocking film 261 are formed, a variety of impurity injection processes may be performed on the substrate 100, and so on, using the first gate stacks 115 and the second gate stacks 215 as masks. While the impurity injection process is being performed, the first gate hard mask 125 and the second gate hard mask 225 are exposed to the impurity injection process. As the exposure to the impurity injection process described above is repeated, the characteristics of the first gate hard mask 125 and the second gate hard mask 225 may be deteriorated, e.g., portions of the first gate hard mask 125 and the second gate hard mask 225 may be removed.

If the first blocking film 161 and the second blocking film 261 were not formed on the first gate hard mask 125 and the second gate hard mask 225, respectively, after the impurity injection process, the deteriorated first gate hard mask 125 and second gate hard mask 225 would not be able to protect the first gate electrode 121 and the second gate electrode 221 in subsequent processes, e.g., until the process described with reference to FIG. 7.

In detail, as portions of the deteriorated first gate hard mask 125 and second gate hard mask 225 may be lost, e.g., removed, after the impurity injection process, there may be a considerable difference of thickness between the first and second gate hard masks 125, 225. That is, if it is assumed that the first region I and the second region II are NMOS formation region, there may be a considerable difference of thickness between the first and second gate hard masks 125, 225 in the NMOS formation region and the gate hard mask in the PMOS formation region. In such case, an interlayer insulating film (190 in FIG. 7) in the NMOS formation region may still remain on the first and second hard masks 125, 225, thereby leading into process defects.

In contrast, according to embodiments, the first blocking film 161 and the second blocking film 261 are formed on the first gate hard mask 125 and the second gate hard mask 225, respectively. Accordingly, the first gate hard mask 125 and the second gate hard mask 225 are protected from repeated exposure to the impurity injection process or other damage, thereby minimizing process defects.

Figure 4:
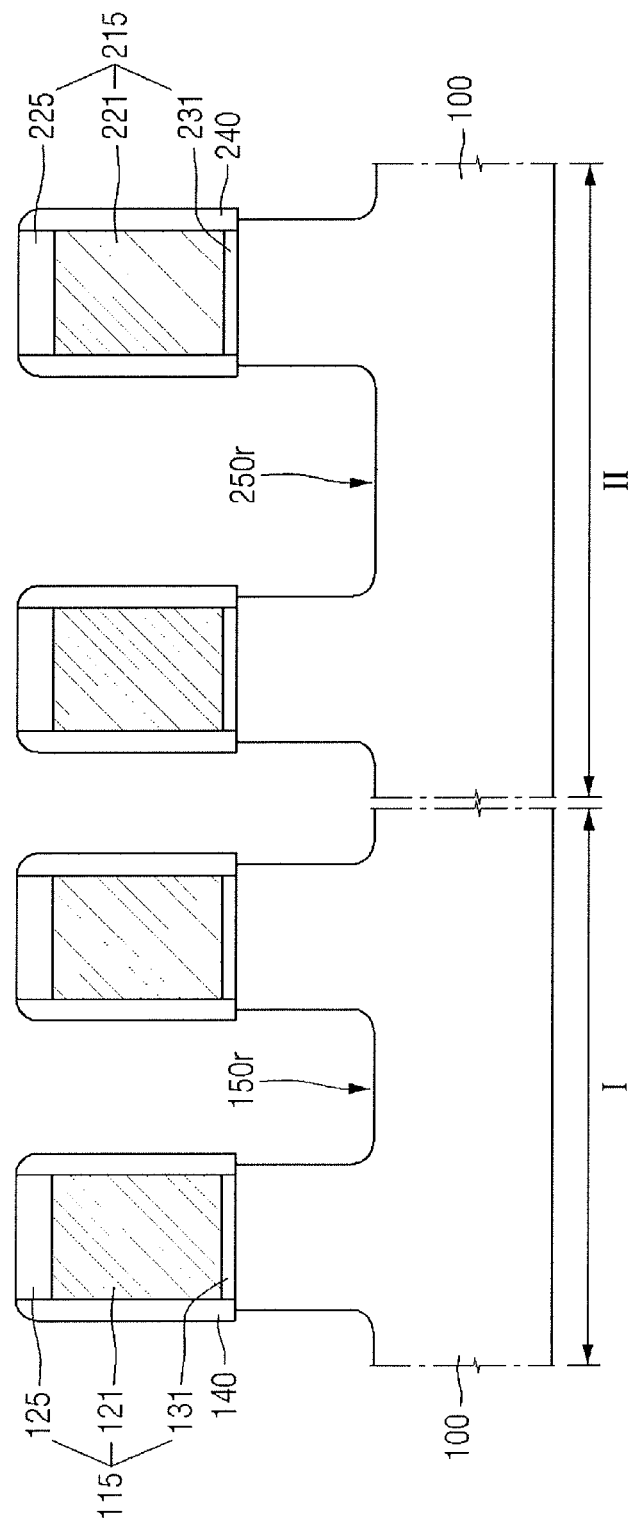

Referring to FIG. 4, a first recess 150r may be formed between the first gate stacks 115 by removing a portion of the first blocking film 161, the first spacer film 141, and the substrate 100 in the first region I. A second recess 250r may be formed between the second gate stacks 215 by removing a portion of the second blocking film 261, the second spacer film 241, and the substrate 100 in the second region II.

Using the first gate stacks 115 as masks, a portion of the first blocking film 161, the first spacer film 141, and the substrate 100 in the first region I may be removed. By doing so, the first recess 150r may be formed. Using the second gate stacks 215 as masks, a portion of the second blocking film 261, the second spacer film 241, and the substrate 100 in the second region II may be removed. By doing so, the second recess 250r may be formed.

Before the first recess 150r is formed, the first gate spacer 140 may be formed on the sidewalls of the first gate stacks 115. The first gate spacer 140 may be formed by the directional etching of the first spacer film 141. Before the second recess 250r is formed, the second gate spacer 240 may be formed on the sidewalls of the second gate stacks 215. The second gate spacer 240 may be formed by the directional etching of the second spacer film 241.

The first gate spacer 140 and the first recess 150r may be formed by the same etch process, or different etch processes from each other. The second gate spacer 240 and the first gate spacer 140 are formed by the same etch process. Further, the second recess 250r is formed by the same etch process as the first recess 150r.

As illustrated in FIG. 4, while the first blocking film 161 on the sidewalls and the upper surfaces of the first gate stacks 115, and the second blocking film 261 on the sidewalls and the upper surfaces of the second gate stacks 215 are illustrated as being entirely removed, this is only for illustrative purpose, and exemplary embodiments are not limited thereto.

If the first blocking film 161 and the second blocking film 261 are completely removed, the first pitch ('P1' in FIG. 1) by which the first gate stacks 115 are spaced apart is less than the second pitch ('P2' in FIG. 1) by which the second gate stacks 215 are spaced apart. As such, the substrate 100 between the second gate stacks 215 may be etched further than the substrate 100 between the first gate stacks 115.

When the depth of the first recess 150r formed in the first region I is less than the depth of the second recess 250r formed in the second region II, performance of the semiconductor device may be reduced. However, when the first blocking film 161 and the second blocking film 261 are formed, e.g., simultaneously, according to embodiments, the thickness of the insulating film on the substrate 100 between the second gate stacks 215 is greater than the thickness of the insulating film on the substrate 100 between the first gate stacks 115. That is, the etching time of the substrate 100 between the second gate stacks 215 is less than the etching time of the substrate 100 between the first gate stacks 115. This is because the time for removing the thicker insulating film on the substrate 100 between the second gate stacks 215 is greater than the time for removing the thinner insulating film on the substrate 100 between the first gate stacks 115. As a result, the difference of depth between the first recess 150r formed in the first region I and the second recess 250r formed in the second region II may be reduced. In other words, formation of a thicker insulating film between the second gate stacks 215 with the larger pitch may slow down etching between the second gate stacks 215, e.g., as compared to simultaneous etching between the first gate stacks 115, thereby providing a smaller depth of a resultant recess in the second gate stacks 215.

Figure 5:
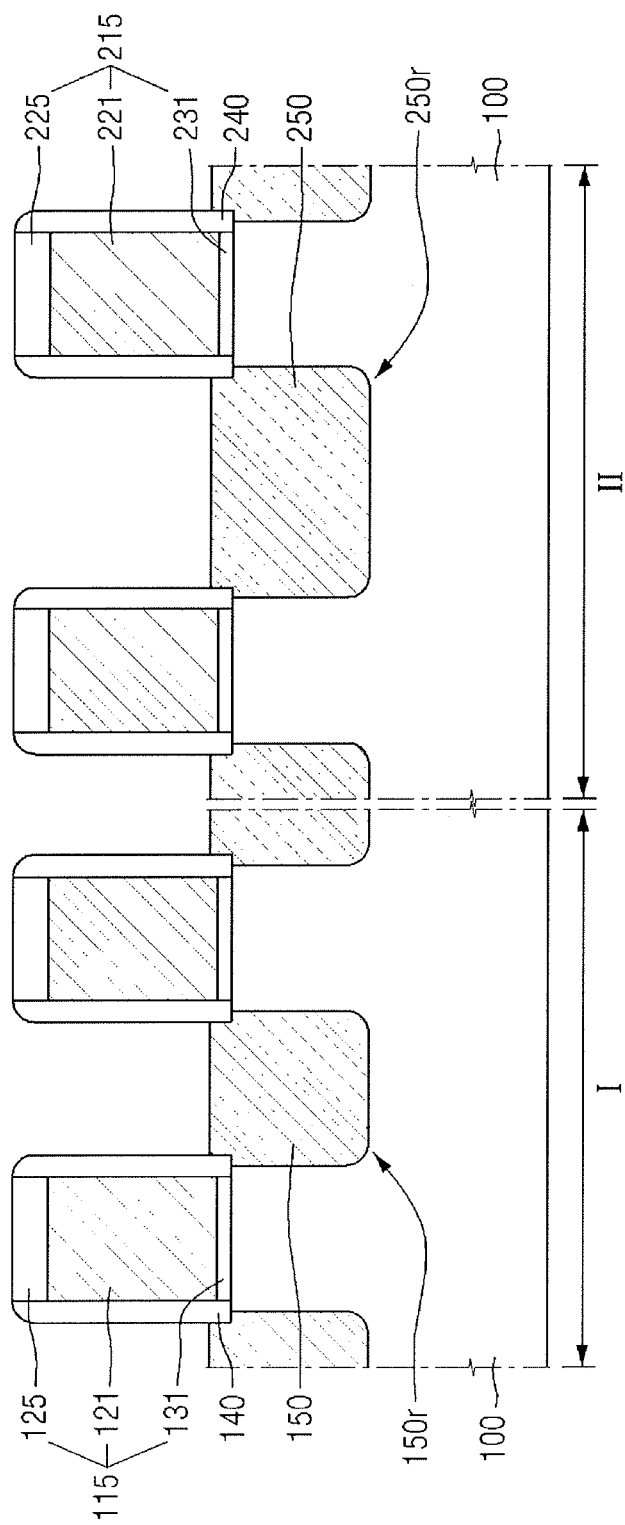

Referring to FIG. 5, a first epitaxial pattern 150 filling the first recess 150r, and a second epitaxial pattern 250 filling the second recess 250r may be formed within the substrate 100. The first epitaxial pattern 150 and the second epitaxial pattern 250 may be a source/drain region of a semiconductor device fabricated with a method for fabricating a semiconductor device according to some exemplary embodiments of the present disclosure.

When the semiconductor device fabricated according to example embodiments is a PMOS transistor, the first epitaxial pattern 150 and the second epitaxial pattern 250 may include a compressive stress material. When the substrate 100 is a silicon substrate, the compressive stress material may be a material that has a higher lattice constant than Si, e.g., SiGe. The compressive stress material can enhance carrier mobility in the channel region by exerting compressive stress on the substrate 100.

When the semiconductor device fabricated according to embodiments is an NMOS transistor, the first epitaxial pattern 150 and the second epitaxial pattern 250 may include a tensile stress material. For example, when the substrate 100 is a silicon substrate, the first epitaxial pattern 150 and the second epitaxial pattern 250 may be a material that has a smaller lattice constant than Si, e.g., SiC. The tensile stress material can enhance carrier mobility in the channel region by exerting tensile stress on the substrate 100. Further, when the semiconductor device fabricated according to embodiments is an NMOS transistor, the first epitaxial pattern 150 and the second epitaxial pattern 250 may include the same material (i.e., silicon) as the substrate 100.

Figure 6:
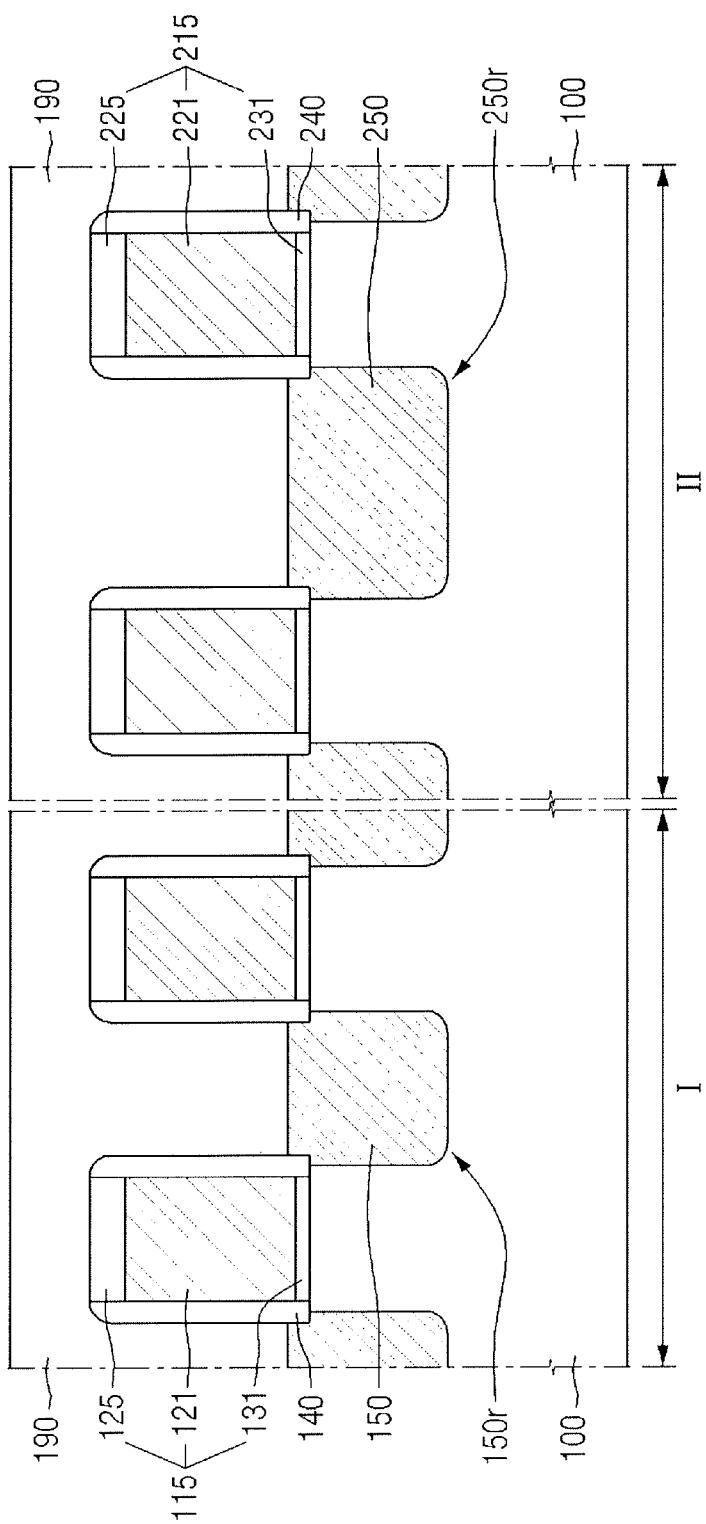

Referring to FIG. 6, an interlayer insulating film 190 covering the first epitaxial pattern 150, the second epitaxial pattern 250, the first gate stacks 115, and the second gate stacks 215 may be formed on the substrate 100. The interlayer insulating film 190 may include at least one of, e.g., silicon oxide, silicon nitride, silicon oxynitride, and a low-k dielectric material. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Figure 7:
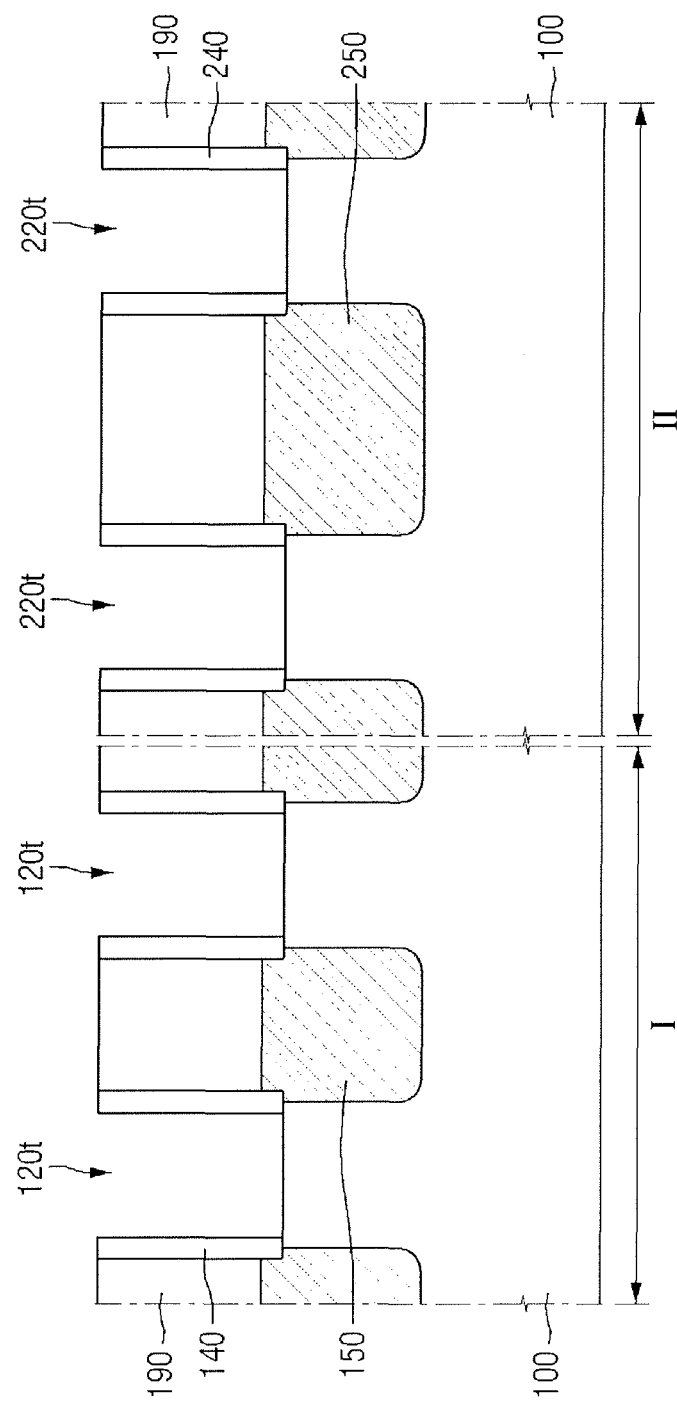

Referring to FIG. 7, the interlayer insulating film 190 may be planarized until the upper surfaces of the first gate electrode 121 and the second gate electrode 221 are exposed. Accordingly, the first gate hard mask 125 and the second gate hard mask 225 may be removed.

Next, the first gate electrode 121 and the first gate insulating film 131 may be removed to thus form a first trench 120t within the interlayer insulating film 190. The second gate electrode 221 and the second gate insulating film 231 may be removed to thus form a second trench 220t within the interlayer insulating film 190. The first trench 120t may be defined by the first gate spacer 140, and the second trench 220t may be defined by the second gate spacer 240.

The first gate electrode 121 and the second gate electrode 221 may be removed using a wet or dry process. In detail, the first gate electrode 121 and the second gate electrode 221 may be substantially removed by exposure to an aqueous solution containing a hydroxide source at a sufficient temperature for a sufficient time. The hydroxide source may include ammonium hydroxide or tetraalkyl ammonium hydroxide, e.g., tetramethyl ammonium hydroxide (TMAH), but not limited thereto.

The first gate insulating film 131 and the second gate insulating film 231 may be removed by wet etching, dry etching or a combination thereof. An etching solution or an etching gas may be varied depending on materials of the first gate insulating film 131 and the second gate insulating film 231.

Figure 8:
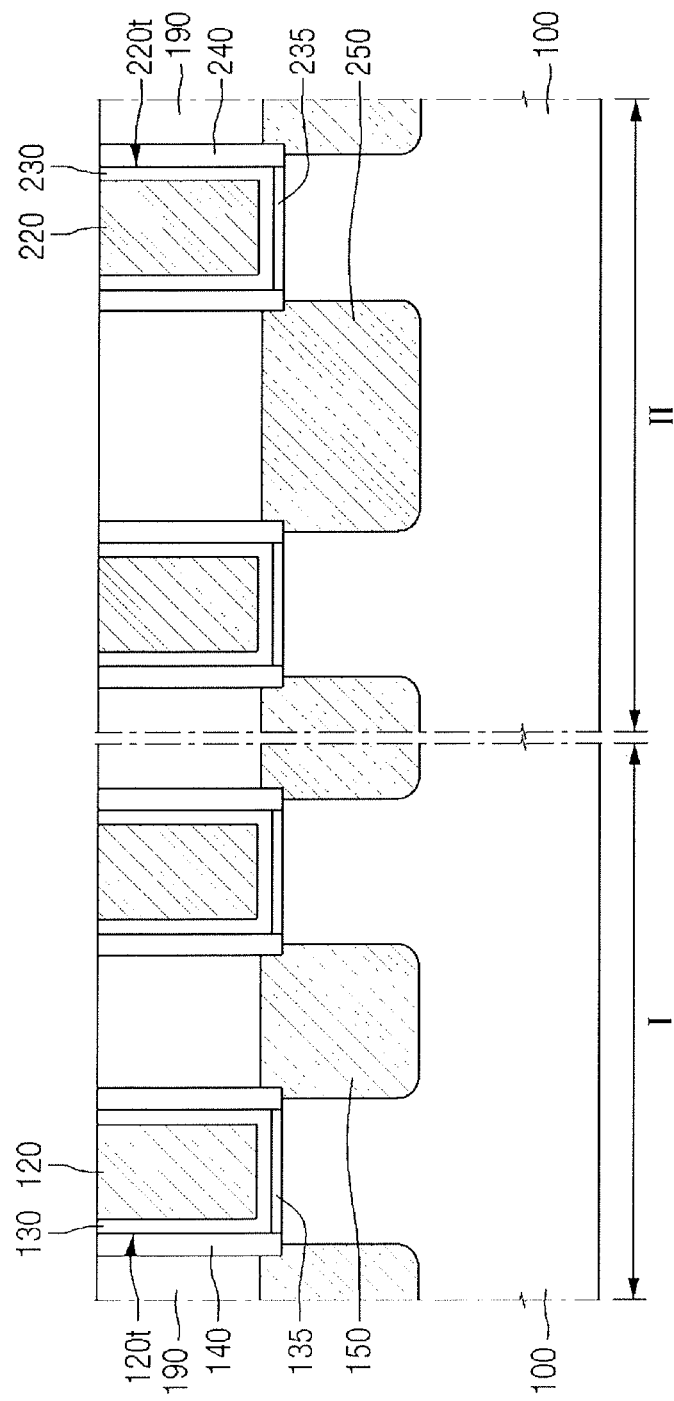

Referring to FIG. 8, a first interfacial layer 135 may be formed on the bottom surface of the first trench 120t and a second interfacial layer 235 may be formed on the bottom surface of the second trench 220t. The first interfacial layer 135 and the second interfacial layer 235 may include a silicon oxide film. The first interfacial layer 135 and the second interfacial layer 235 may be formed by, e.g., chemical oxidation, UV oxidation, or dual plasma oxidation, and so on, but not limited thereto. For example, unlike the illustration in FIG. 8, depending on a method used for forming the first interfacial layer 135 and the second interfacial layer 235, the first interfacial layer 135 may extend along the sidewall of the first trench 120t, and the second interfacial layer 235 may extend along the sidewall of the second trench 220t.

In another example, as illustrated in FIG. 8, a third gate insulating film 130 may be formed on the first interfacial layer 135. The third gate insulating film 130 may be formed along the sidewall and the bottom surface of the first trench 120t.

A fourth gate insulating film 230 may be formed on the second interfacial layer 235. The fourth gate insulating film 230 may be formed along the sidewall and the bottom surface of the second trench 220t.

The third gate electrode 120 filling the first trench 120t may be formed on the third gate insulating film 130. The third gate electrode 120 may be formed in the first trench 120t.

The fourth gate electrode 220 filling the second trench 220t may be formed on the fourth gate insulating film 230. The fourth gate electrode 220 may be formed in the second trench 220t.

The third gate insulating film 130 and the fourth gate insulating film 230 may each be, e.g., SiON, $Ge_xO_yN_z$, $Ge_xSi_yO_z$, a high-k dielectric material, a combination thereof, or a stack film in which these are stacked in order. For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. Further, while the high-k dielectric material described above is explained mainly with reference to oxides, alternatively, the high-k dielectric material may include one or more of the nitride (e.g., hafnium nitride) or the oxynitride (e.g., hafnium oxynitride) of the metal materials (e.g., hafnium) described above, but not limited thereto.

The third gate electrode 120 and the fourth gate electrode 220 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

The third gate electrode 120 and the fourth gate electrode 220 may each include a conductive metal oxide, a conductive metal oxynitride, and so on, and may include an oxidized form of the materials described above. The third gate electrode 120 and the fourth gate electrode 220 may be replacement metal gate electrodes that are formed by replacement process.

Hereinbelow, a method for fabricating a semiconductor device according to some exemplary embodiments will be described with reference to FIGS. 1, 2, and 4 to 10. For convenience of description, the following description will be made based on differences relative to the description with respect to FIGS. 1 to 8.

Figure 9:
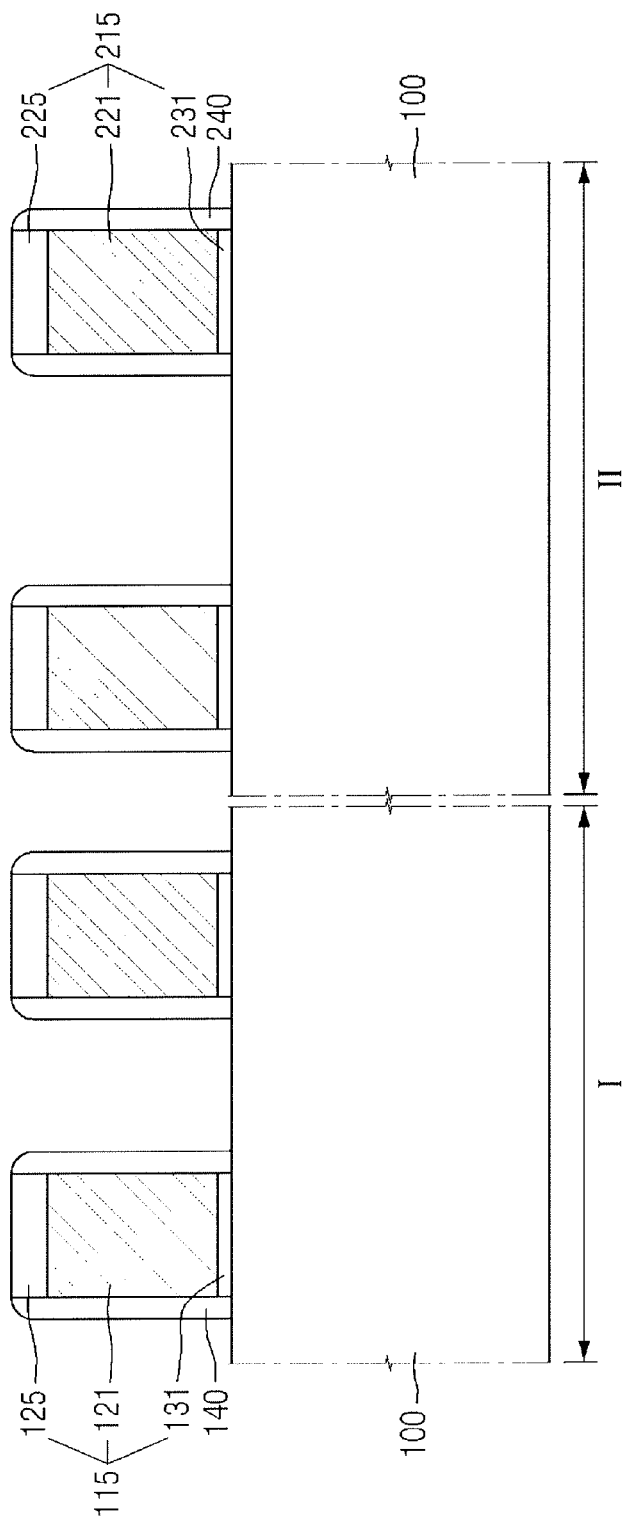
FIGS. 9 and 10 illustrate cross-sectional views of intermediate stages in a method for fabricating a semiconductor device according to some exemplary embodiments.
Figure 10:
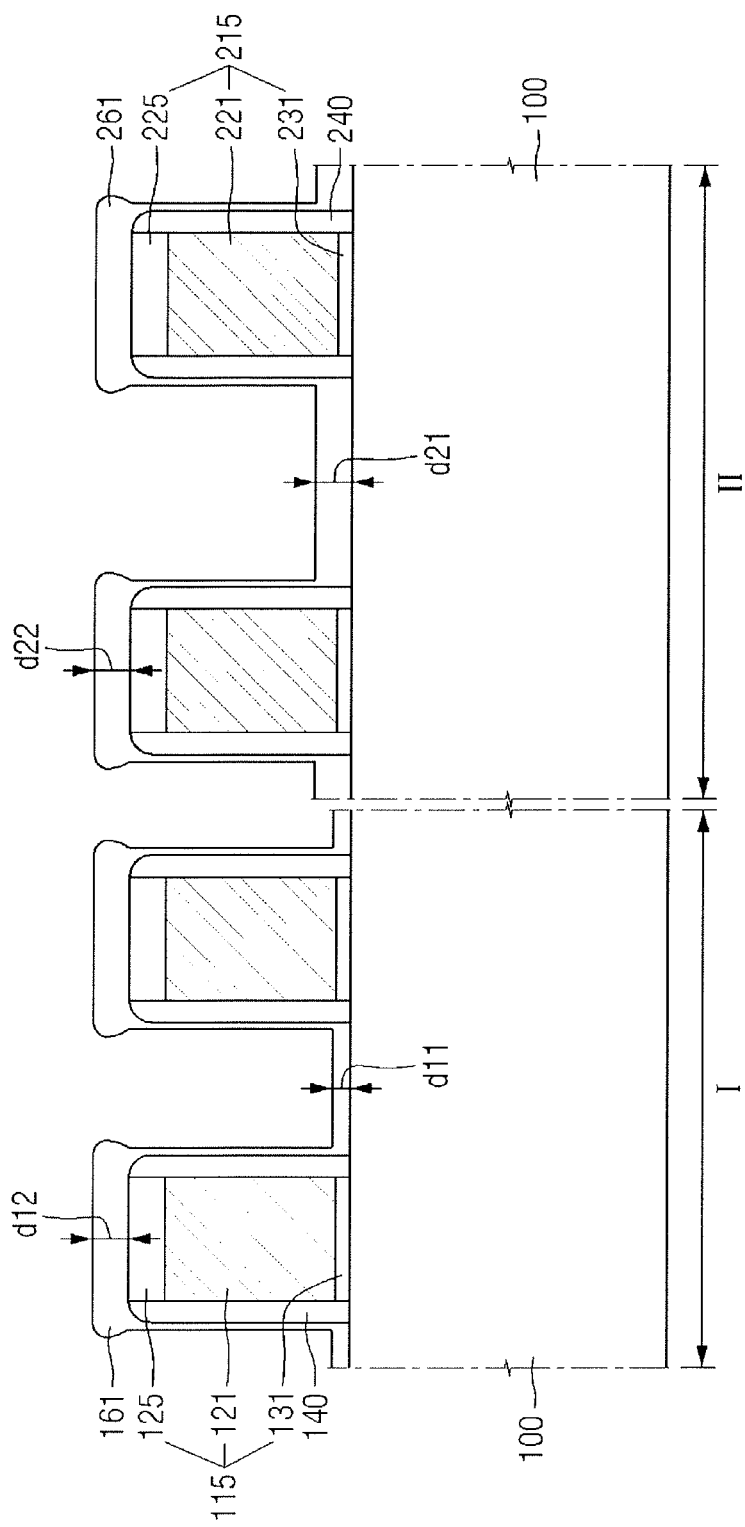

FIGS. 9 and 10 are views illustrating intermediate stages of fabrication, provided to explain a method for fabricating a semiconductor device according to some exemplary embodiments. For reference, FIG. 9 may involve a process performed after FIG. 2.

Referring to FIG. 9, the first gate spacer 140 may be formed on the sidewalls of the first gate stacks 115 by etching the first spacer film 141. The second gate spacer 240 may be formed on the sidewalls of the second gate stacks 215 by etching the second spacer film 241. The first gate spacer 140 and the second gate spacer 240 may be formed by the directional etching of the first spacer film 141 and the second spacer film 241.

Referring to FIG. 10, the first blocking film 161 may be formed on the first gate spacer 140 and the first gate stacks 115, and the second blocking film 261 may be formed on the second gate spacer 240 and the second gate stacks 215. The first blocking film 161 may be formed along the sidewalls and the upper surfaces of the first gate stacks 115 on which the first gate spacer 140 is formed. The second blocking film 261 may be formed along the sidewalls and the upper surfaces of the second gate stacks 215 on which the second gate spacer 240 is formed.

Referring to FIG. 4, the first recess 150r may be formed between the first gate stacks 115 by removing a portion of the first blocking film 161 and the substrate 100 in the first region I. The second recess 250r may be formed between the second gate stacks 215 by removing a portion of the second blocking film 261 and the substrate 100 in the second region II.

Hereinbelow, a method for fabricating a semiconductor device according to some exemplary embodiments will be described with reference to FIGS. 1, 2, 4 to 9, and 11. For convenience of description, the following description will be made based on differences relative to the description with respect to FIGS. 1 to 8.

Figure 11:
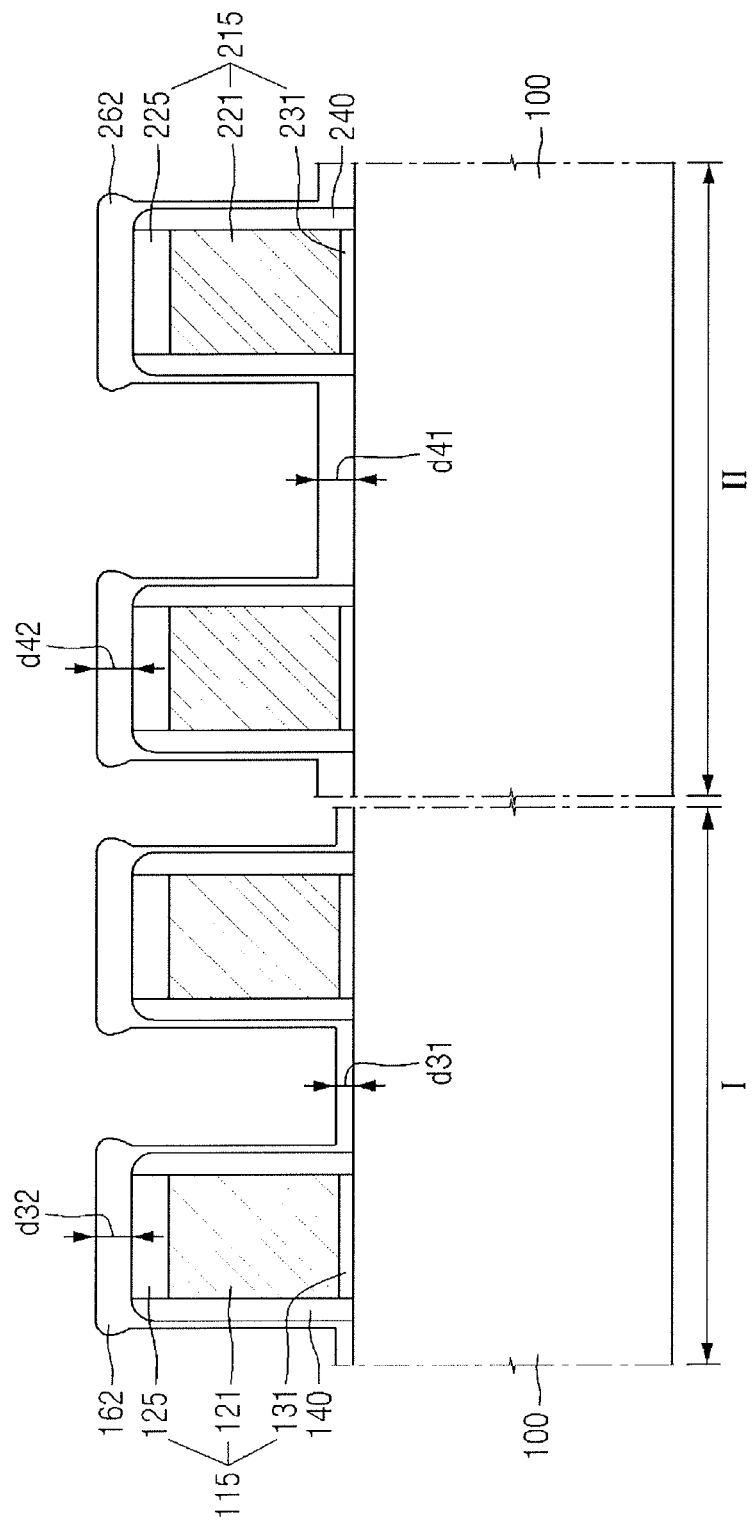
FIG. 11 illustrates a cross-sectional view of an intermediate stage in a method for fabricating a semiconductor device according to some exemplary embodiments.

FIG. 11 is a view illustrating an intermediate stage of fabrication, provided to explain a method for fabricating a semiconductor device according to some exemplary embodiments.

Referring to FIGS. 3 and 9, the first gate spacer 140 may be formed on the sidewalls of the first gate stacks 115 by etching the first blocking film 161 and the first spacer film 141. The second gate spacer 240 may be formed on the sidewalls of the second gate stacks 215 by etching the second blocking film 261 and the second spacer film 241.

Referring to FIG. 11, the third blocking film 162 may be formed on the first gate spacer 140 and the first gate stacks 115, and the fourth blocking film 262 may be formed on the second gate spacer 240 and the second gate stacks 215. The third blocking film 162 may be formed along the first gate stacks 115 on which the first gate spacer 140 is formed. The third blocking film 162 may be formed along the sidewalls and the upper surfaces of the first gate stacks 115. The third blocking film 162 may be formed along the upper surface of the substrate 100 in the first region I.

The fourth blocking film 262 may be formed along the second gate stacks 215 on which the second gate spacer 240 is formed. The fourth blocking film 262 may be formed along the sidewalls and the upper surfaces of the second gate stacks 215. The fourth blocking film 262 may be formed along the upper surface of the substrate 100 in the second region II.

The third blocking film 162 and the fourth blocking film 262 may include, e.g., silicon oxide ($SiO_2$). The third blocking film 162 and the fourth blocking film 262 may be formed by using, e.g., a deposition method with poor step coverage. The third blocking film 162 and the fourth blocking film 262 may be formed by the same fabrication process.

The third blocking film 162 may not be conformally formed on the sidewalls and the upper surfaces of the first gate stacks 115 on which the first gate spacer 140 is formed. The fourth blocking film 262 may not be conformally formed on the sidewalls and the upper surfaces of the second gate stacks 215 on which the second gate spacer 240 is formed.

The thickness d32 of the third blocking film 162 on the upper surfaces of the first gate stacks 115 may be substantially the same as the thickness d42 of the fourth blocking film 262 on the upper surfaces of the second gate stacks 215. Since the third blocking film 162 is not conformally formed, the thickness d32 of the third blocking film 162 on the upper surfaces of the first gate stacks 115 is greater than the thickness of the third blocking film 162 on the sidewalls of the first gate stacks 115. Since the fourth blocking film 262 is not conformally formed, the thickness d42 of the fourth blocking film 262 on the upper surfaces of the second gate stacks 215 is greater than the thickness of the fourth blocking film 262 on the sidewalls of the second gate stacks 215.

The thickness d32 of the third blocking film 162 on the upper surfaces of the first gate stacks 115 may be greater than the thickness d31 of the third blocking film 162 on the substrate 100 between the first gate stacks 115. The thickness d42 of the fourth blocking film 262 on the upper surfaces of the second gate stacks 215 may be greater than, or equal to the thickness d41 of the fourth blocking film 262 on the substrate 100 between the second gate stacks 215.

Further, the thickness d41 of the fourth blocking film 262 on the substrate 100 between the second gate stacks 215 is greater than the thickness d31 of the third blocking film 162 on the substrate 100 between the first gate stacks 115. Furthermore, the thickness d32 of the third blocking film 162 on the upper surfaces of the first gate stacks 115 may be greater than, or equal to the thickness d41 of the fourth blocking film 262 on the substrate 100 between the second gate stacks 215.

Referring to FIG. 4, the first recess 150r may be formed between the first gate stacks 115 by removing a portion of the third blocking film 162 and the substrate 100 in the first region I. The second recess 250r may be formed between the second gate stacks 215 by removing a portion of the fourth blocking film 262 and the substrate 100 in the second region II.

FIGS. 12 to 15 are views provided to explain a method for fabricating a semiconductor device according to some exemplary embodiments. For convenience of description, the following description will be made based on difference from the description with respect to FIGS. 1 to 8.

Figure 12:
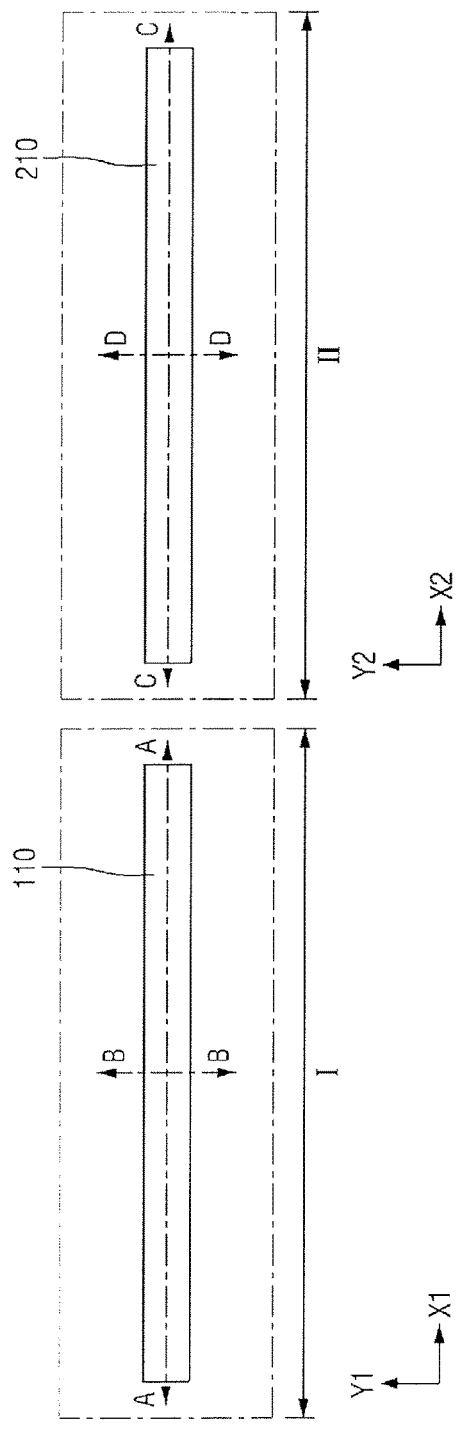
FIGS. 12 to 15 illustrate cross-sectional views of a method for fabricating a semiconductor device according to some exemplary embodiments.
Figure 13:
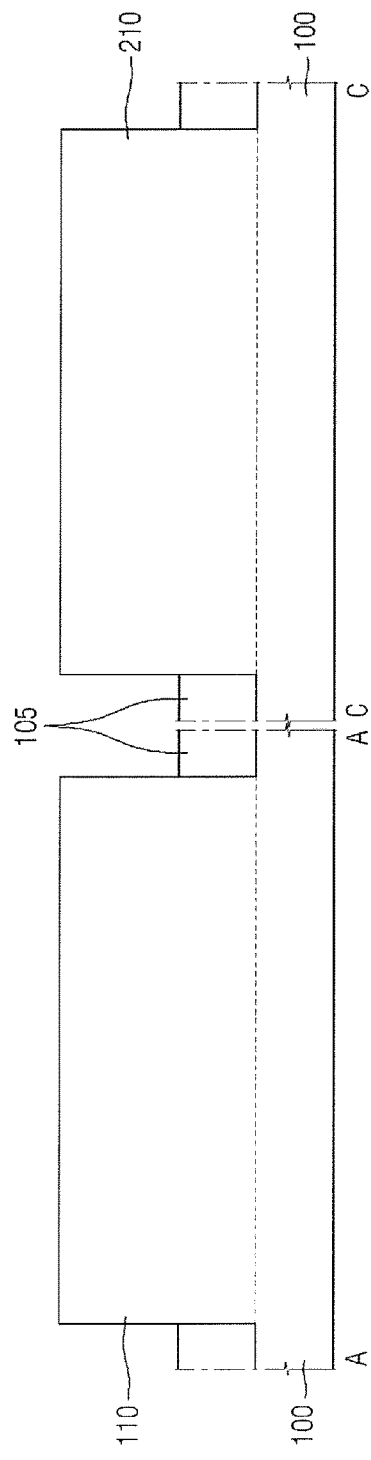
Figure 14:
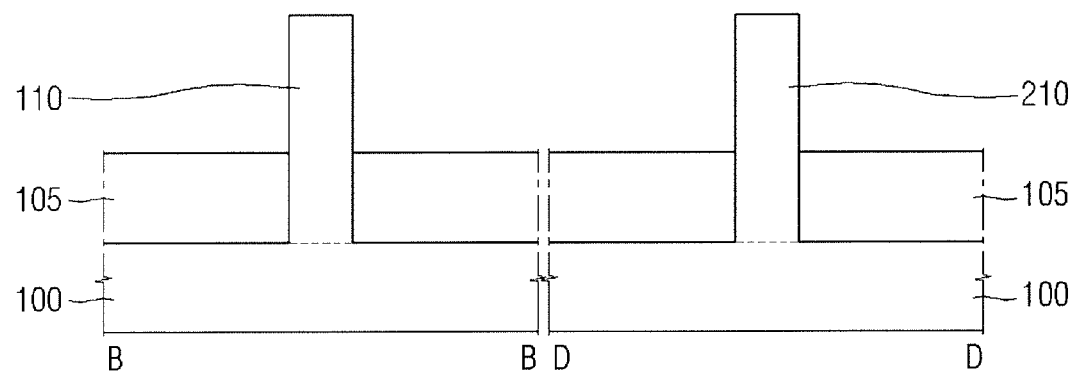

FIG. 13 shows cross sectional views taken along lines A-A and C-C of FIG. 12, and FIG. 14 shows cross sectional views taken on lines B-B and D-D of FIG. 12.

The drawings regarding a method for fabricating a semiconductor device according to some exemplary embodiments exemplify a fin-type field effect transistor (FinFET) including a channel region having a fin-type pattern shape, but not limited thereto. A semiconductor device fabricated by the method for fabricating a semiconductor device according to some exemplary embodiments may include a tunneling transistor (tunneling FET), a transistor including a nanowire, a transistor including a nano-sheet, or a three-dimensional (3D) transistor.

Referring to FIGS. 12 to 14, a first fin-type pattern 110 may be formed in the first region I of the substrate 100, and a second fin-type pattern 210 may be formed in the second region II of the substrate 100. The first fin-type pattern 110 may be elongated in the first direction X1, and the second fin-type pattern 210 may be elongated in the second direction X2.

A field insulating film 105 may be formed on the substrate 100. The field insulating film 105 may partially surround the first fin-type pattern 110 and the second fin-type pattern 210. That is, the first fin-type pattern 110 and the second fin-type pattern 210 may include a portion that protrudes upward higher than the upper surface of the field insulating film 105.

The first fin-type pattern 110 and the second fin-type pattern 210 may each be a portion of the substrate 100, and may include an epitaxial layer grown from the substrate 100. The first fin-type pattern 110 and the second fin-type pattern 210 may include an element semiconductor material, e.g., silicon or germanium. Further, the first fin-type pattern 110 and the second fin-type pattern 210 may include a compound semiconductor, e.g., IV-IV group compound semiconductor or III-V group compound semiconductor. For example, if the IV-IV group compound semiconductor is used, the first fin-type pattern 110 and the second fin-type pattern 210 may include a binary compound or a ternary compound including at least two or more of carbon (C), silicon (Si), germanium (Ge) and tin (Sn), or these compounds doped with IV group element. In an other example, if the III-V group compound semiconductor is used, the first fin-type pattern 110 and the second fin-type pattern 210 may include one of a binary compound, a ternary compound or a quaternary compound which is formed by a combination of a III group element which may be at least one of aluminum (Al), gallium (Ga), and indium (In), with a V group element which may be one of phosphorus (P), arsenic (As) and antimony (Sb).

The following description refers to the cross sectional views taken on lines A-A and C-C of FIG. 13.

Figure 15:
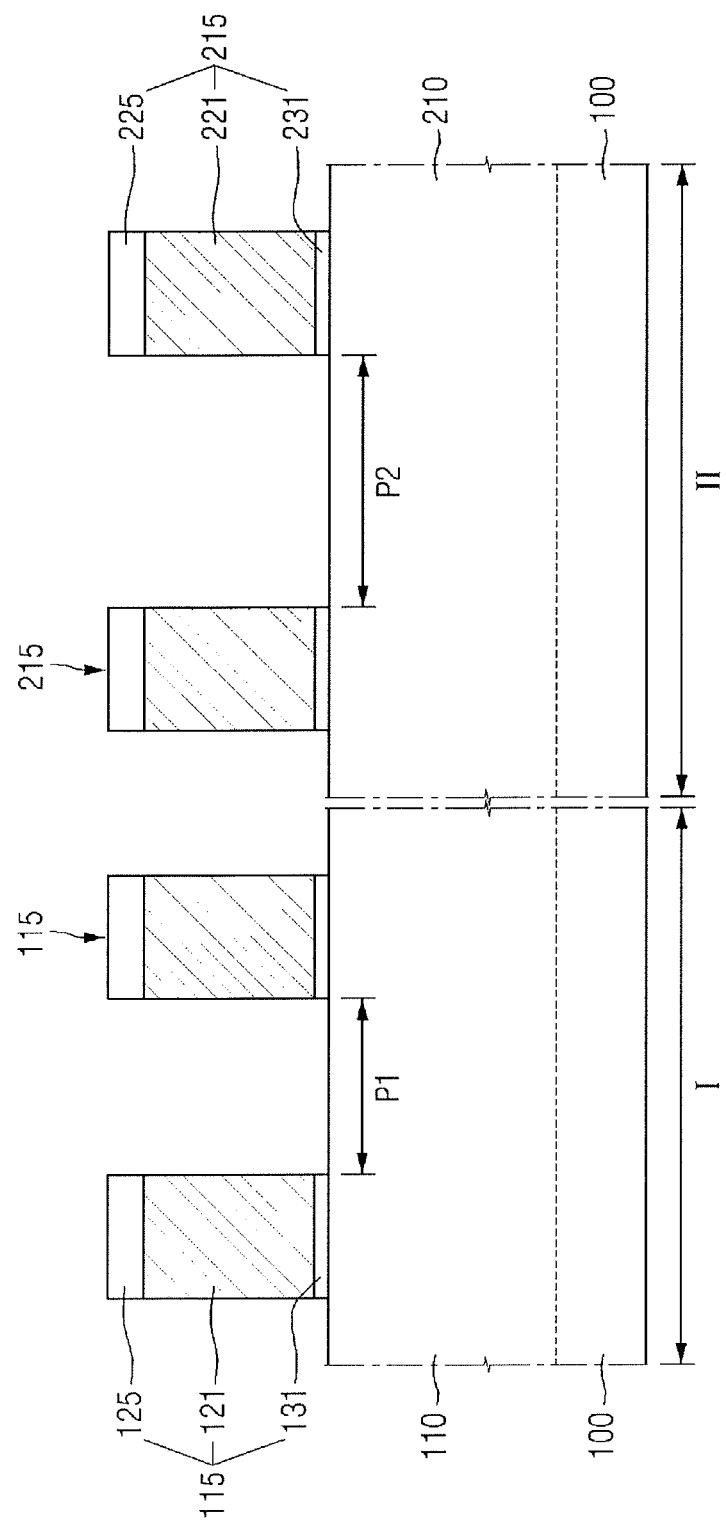

Referring to FIG. 15, on the first fin-type pattern 110, the first gate stacks 115 intersecting the first fin-type pattern 110 may be formed. On the second fin-type pattern 210, the second gate stacks intersecting the second fin-type pattern 210 may be formed. The first gate stacks 115 may be elongated along the third direction (Y1 in FIG. 12), and the second gate stacks 215 may be elongated along the fourth direction (Y2 in FIG. 12). Next, a semiconductor device may be formed with a method for fabricating a semiconductor device according to some exemplary embodiments described above with reference to FIGS. 2 to 11.

By way of summation and review, embodiments provide a method for fabricating a semiconductor device capable of enhancing device performance and reliability by forming an epitaxial pattern in recesses among gate electrodes spaced at different distances from one another, without having a loading effect. That is, prior to forming the recesses among the gate electrodes, a protection layer is formed between adjacent gate stacks, such that a thickness of the protection layer between gate stacks with a smaller pitch is smaller than a thickness of the protection layer between gate stacks with a larger pitch. Accordingly, during formation of recesses between the gate stacks, the depth difference among the gate stacks may be minimized, thereby increasing uniformity of the epitaxial patterns in the gate stacks.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
    forming first gate stacks on a first region of a substrate, such that the first gate stacks are spaced apart by a first distance;
    forming second gate stacks on a second region of the substrate, such that the second gate stacks are spaced apart by a second distance greater than the first distance;
    forming a first blocking film along the first gate stacks and the substrate in the first region, a thickness of the first blocking film on the substrate between the first gate stacks being a first thickness;
    forming a second blocking film along the second gate stacks and the substrate in the second region, a thickness of the second blocking film on the substrate between the second gate stacks being a second thickness that is different from the first thickness; and
    removing the first blocking film, the second blocking film, and the substrate to form a first recess between the first gate stacks and a second recess between the second gate stacks.

2. The method as claimed in claim 1, wherein the second thickness is greater than the first thickness.

3. The method as claimed in claim 1, wherein a thickness of the first blocking film on upper surfaces of the first gate stacks is substantially the same as a thickness of the second blocking film on upper surfaces of the second gate stacks.

4. The method as claimed in claim 3, wherein the thickness of the first blocking film on the upper surfaces of the first gate stacks is equal to, or greater than the second thickness.

5. The method as claimed in claim 1, further comprising:
    prior to forming the first blocking film and the second blocking film, forming a spacer film along the first gate stacks and the second gate stacks, and
    after forming the first blocking film and the second blocking film, forming a first gate spacer on sidewalls of the first gate stacks and a second gate spacer on sidewalls of the second gate stacks.

6. The method as claimed in claim 1, further comprising:
    prior to forming the first blocking film, forming a first gate spacer on sidewalls of the first gate stacks, and
    prior to forming the second blocking film, forming a second gate spacer on sidewalls of the second gate stacks.

7. The method as claimed in claim 6, further comprising:
    prior to forming the first gate spacer, forming a third blocking film along the first gate stacks and the substrate in the first region, and
    prior to forming the second gate spacer, forming a fourth blocking film along the second gate stacks and the substrate in the second region.

8. The method as claimed in claim 1, further comprising forming a first fin-type pattern on the substrate in the first region and a second fin-type pattern on the substrate in the second region,
    wherein the first gate stacks are formed so as to intersect the first fin-type pattern, and the second gate stacks are formed so as to intersect the second fin-type pattern.

9. The method as claimed in claim 1, further comprising:
    forming a first epitaxial pattern filling the first recess and a second epitaxial pattern filling the second recess, and
    forming an interlayer insulating film covering the first epitaxial pattern, the second epitaxial pattern, the first gate stacks, and the second gate stacks.

10. The method as claimed in claim 9, further comprising:
    removing the first gate stacks and the second gate stacks to form a first trench and a second trench within the interlayer insulating film, and
    forming a first replacement metal gate electrode within the first trench, and a second replacement metal gate electrode within the second trench.

11. A method for fabricating a semiconductor device, the method comprising:
    forming first gate stacks on a first region of a substrate, such that the first gate stacks are spaced apart by a first distance;
    forming second gate stacks on a second region of the substrate, such that the second gate stacks are spaced apart by a second distance greater than the first distance;
    conformally forming a spacer film along the first gate stacks, the second gate stacks, and upper surfaces of the substrate; and
    forming a blocking film along the first gate stacks, the second gate stacks, and the upper surfaces of the substrate, after forming the spacer film,
    wherein a thickness of the blocking film on the substrate between the first gate stacks is less than a thickness of the blocking film on the substrate between the second gate stacks,
    wherein a thickness of the blocking film on upper surfaces of the first gate stacks is greater than the thickness of the blocking film on the substrate between the first gate stacks, and
    wherein a thickness of the blocking film on upper surfaces of the second gate stacks is equal to, or greater than the thickness of the blocking film on the substrate between the second gate stacks.

12. The method as claimed in claim 11, further comprising:

forming a first recess between the first gate stacks and a second recess between the second gate stacks by removing the blocking film and the substrate using the first gate stacks and the second gate stacks as a mask, and forming a first epitaxial pattern filling the first recess and a second epitaxial pattern filling the second recess.

13. The method as claimed in claim 11, wherein the thickness of the blocking film on the upper surfaces of the first gate stacks is substantially the same as the thickness of the blocking film on the upper surfaces of the second gate stacks.

14. The method as claimed in claim 11, further comprising, after forming the blocking film, forming a first gate spacer on sidewalls of the first gate stacks and a second gate spacer on sidewalls of the second gate stacks by etching the spacer film.

15. The method as claimed in claim 11, further comprising, before forming the blocking film, forming a first gate spacer on sidewalls of the first gate stacks and a second gate spacer on sidewalls of the second gate stacks by etching the spacer film.

16. A method for fabricating a semiconductor device, the method comprising:

forming first gate stacks on a first region of a substrate, such that the first gate stacks are spaced apart by a first distance;

forming second gate stacks on a second region of the substrate, such that the second gate stacks are spaced apart by a second distance greater than the first distance;

forming a first blocking film along the first gate stacks and the substrate in the first region, a thickness of the first blocking film on the substrate between the first gate stacks being a first thickness;

forming a second blocking film along the second gate stacks and the substrate in the second region, a thickness of the second blocking film on the substrate between the second gate stacks being a second thickness larger than the first thickness; and etching the substrate between adjacent first gate stacks and adjacent second gate stacks through the first blocking film and the second blocking film, respectively, to form a first recess between adjacent first gate stacks and a second recess between adjacent second gate stacks.

17. The method as claimed in claim 16, wherein etching of the first and second regions of the substrate is performed simultaneously.

18. The method as claimed in claim 16, wherein forming the second blocking film includes adjusting the second thickness of the second blocking film, such that a depth difference between the first and second recesses is minimized.

19. The method as claimed in claim 16, wherein forming the first and second blocking films includes performing simultaneous deposition with poor step coverage in the first and second regions.

20. The method as claimed in claim 19, wherein thicknesses of the first and second blocking films on upper surfaces of the first and second gate stacks, respectively, is larger than thicknesses of the first and second blocking films on side surfaces of the first and second gate stacks, respectively.

* * * * *